(12) United States Patent
Yoda

(10) Patent No.: US 8,907,688 B2
(45) Date of Patent: Dec. 9, 2014

(54) METHOD AND DEVICE FOR SUPPLYING CLOCK

(75) Inventor: Hiroyoshi Yoda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 409 days.

(21) Appl. No.: 13/204,971

(22) Filed: Aug. 8, 2011

(65) Prior Publication Data

US 2012/0038378 A1 Feb. 16, 2012

(30) Foreign Application Priority Data

Aug. 12, 2010 (JP) ................................. 2010-180684

(51) Int. Cl.
- G01R 31/308 (2006.01)
- G01R 31/00 (2006.01)
- G01R 19/00 (2006.01)
- H04B 1/16 (2006.01)
- H03B 1/00 (2006.01)
- H03L 3/00 (2006.01)

(52) U.S. Cl.
CPC ........................................ *H03L 3/00* (2013.01)
USPC ................. 324/750.3; 324/750.02; 324/76.11; 455/208; 331/74

(58) Field of Classification Search
CPC ....................... G01R 31/31725; G01R 31/2843
USPC ........................................ 324/750.3; 340/635
See application file for complete search history.

(56) References Cited

U.S. PATENT DOCUMENTS

| | | | | |
|---|---|---|---|---|
| 4,704,587 A | * | 11/1987 | Ouyang et al. | 331/116 FE |
| 5,565,782 A | * | 10/1996 | Sato | 324/435 |
| 5,883,523 A | * | 3/1999 | Ferland et al. | 324/750.02 |
| 6,911,873 B2 | * | 6/2005 | Yin et al. | 331/74 |
| 2007/0170909 A1 | * | 7/2007 | Vorenkamp et al. | 324/76.11 |
| 2007/0174527 A1 | * | 7/2007 | Vorenkamp | 710/100 |
| 2008/0146180 A1 | * | 6/2008 | Yoda et al. | 455/208 |
| 2009/0102503 A1 | * | 4/2009 | Saito | 324/765 |

FOREIGN PATENT DOCUMENTS

| | | |
|---|---|---|
| JP | 2004-64445 | 2/2004 |
| JP | 2008-153910 | 7/2008 |
| JP | 2008-187370 | 8/2008 |

OTHER PUBLICATIONS

European Search Report dated Jun. 21, 2012 from corresponding European Application No. 11 17 7146.

Office Action of Japanese Patent Application No. 2010-180684 dated Mar. 11, 2014 with Partial Translation.

* cited by examiner

*Primary Examiner* — Jermele M Hollington
*Assistant Examiner* — Christopher McAndrew
(74) *Attorney, Agent, or Firm* — Katten Muchin Rosenman LLP

(57) ABSTRACT

A clock supplying device for supplying a clock signal to be used in an operation of a communication apparatus, includes an oscillator for generating the clock signal; a measurement unit for acquiring a reference clock signal extracted from a transmission line connected to the communication apparatus, and measuring a frequency difference between the clock signal and the reference clock signal; and a determiner for determining whether a warm-up operation of the oscillator unit has been completed or not, in accordance with measurement results of the frequency difference and a status of power supplying.

7 Claims, 15 Drawing Sheets

FIG. 11

| OWN SYSTEM \ OTHER SYSTEM | POWER OFF | WARM-UP IN PROGRESS | NORMAL | FAULT |
|---|---|---|---|---|
| POWER OFF | STATE#1 | – | – | – |
| WARM-UP IN PROGRESS | – | STATE#2 | STATE#4 | STATE#8 |
| NORMAL | – | STATE#3 | STATE#5 | STATE#9 |
| FAULT | – | STATE#6 | STATE#7 | STATE#10 |

FIG. 12

| EVENT | STATE#1 | STATE#2 | STATE#3 | STATE#4 | STATE#5 |
|---|---|---|---|---|---|
| POWER ON | STATE#2 | – | – | – | – |
| POWER OFF | – | STATE#1 | STATE#1 | STATE#1 | STATE#1 |
| OWN SYSTEM FREQUENCY ACCEPTABLE | – | STATE#3 | – | STATE#5 | – |
| OTHER SYSTEM FREQUENCY ACCEPTABLE | – | STATE#4 | STATE#5 | – | – |
| OWN SYSTEM FREQUENCY UNACCEPTABLE | – | – | STATE#6 | – | STATE#7 |
| OTHER SYSTEM UNACCEPTABLE | – | – | – | STATE#8 | STATE#9 |
| TIME-OUT | – | STATE#10 | STATE#9 | STATE#7 | – |

| EVENT | STATE#6 | STATE#7 | STATE#8 | STATE#9 | STATE#10 |
|---|---|---|---|---|---|
| POWER ON | – | – | – | – | – |
| POWER OFF | STATE#1 | STATE#1 | STATE#1 | STATE#1 | STATE#1 |
| OWN SYSTEM FREQUENCY ACCEPTABLE | STATE#3 | STATE#5 | STATE#9 | – | STATE#9 |
| OTHER SYSTEM FREQUENCY ACCEPTABLE | STATE#7 | – | STATE#4 | STATE#5 | STATE#7 |
| OWN SYSTEM FREQUENCY UNACCEPTABLE | – | – | – | STATE#10 | – |
| OTHER SYSTEM UNACCEPTABLE | – | STATE#10 | – | – | – |
| TIME-OUT | STATE#10 | – | STATE#10 | – | – |

FIG. 14

| N SYSTEM (E SYSTEM) | SYSTEM CLOCK SEL SIGNAL | STATE DISPLAY |
|---|---|---|
| STATE #1 (#1) | OFF | – |
| STATE#2(#2) | OFF | WARM-UP IN PROGRESS (N/E) |
| STATE#3(#4) | N SYSTEM ON OR OFF | WARM-UP IN PROGRESS (E) |
| STATE#4(#3) | OFF | WARM-UP IN PROGRESS (N) |
| STATE#5(#5) | N SYSTEM ON | NORMAL |
| STATE#6(#8) | OFF | N SYSTEM FAULTY AND WARM-UP IN PROGRESS(E) |
| STATE#7(#9) | E SYSTEM ON | N SYSTEM FAULTY |
| STATE#8(#6) | OFF | E SYSTEM FAULTY AND WARM-UP IN PROGRESS(N) |
| STATE#9(#7) | N SYSTEM ON | E SYSTEM FAULTY |
| STATE#10(#10) | OFF | REFERENCE CLOCK FAULTY |

METHOD AND DEVICE FOR SUPPLYING CLOCK

CROSS-REFERENCE TO RELATED APPLICATION

This application is based upon and claims the benefit of priority of prior Japanese Patent Application No. 2010-180684, filed on Aug. 12, 2010, the entire contents of which are incorporated herein by reference.

FIELD

A certain aspect of the embodiments discussed herein relates to supplying a clock signal.

BACKGROUND

A communication apparatus such as a radio base station includes a clock supplying device. The clock supplying device supplies a clock signal to be used in a signal process of the communication apparatus. The clock supplying device may include an oven controlled crystal oscillator (OCXO) as an oscillator generating the clock signal. The OCXO includes a crystal oscillator housed in a constant temperature oven, and generates and outputs the clock signal on a stable frequency.

The constant temperature oven is typically set at a relatively high temperature within a range of 70° C. to 80° C. to stabilize the oscillation frequency. A warm-up period may last from when the communication apparatus starts to be supplied with power from power on to when the constant temperature oven rises and reaches a specific temperature. During the warm-up period, the oscillation frequency remains unstable. While the OCXO is in a warm-up period, the communication apparatus may stop part or whole of the signal processing operation thereof.

In one method, a constant period of time from the power-on may be treated as a warm-up period in the warm-up control of the OCXO. In this method, however, the supplying of the clock signal remains stopped until the constant period of time has elapsed even if the warm-up operation is complete in practice. The power supplying may be interrupted and shortly restored. In such a case, the constant temperature oven may be already high when the power supplying resumes. The warm-up operation may be complete within a short period of time. Even in such a case, the communication apparatus is forced to wait on standby until the constant period of time has elapsed.

Another type of radio base station includes an OCXO and a temperature compensated crystal oscillator (TCXO). This type of radio base station compares a clock, into which an output of the OCXO is frequency divided, with a clock, into which an output of the TCXO is frequency-divided, and determines whether the OCXO has completed the warm-up operation in response to the phase difference. This arrangement shortens an excessively long warm-up waiting time.

Another type of clock supplying device has a duplicate structure to detect a fault therewithin. The clock supplying device measures a frequency difference between a reference clock input from the outside for system synchronization and each of the output clocks of an operative OCXO and a backup OCXO. The clock supplying device then identifies a fault in an operative clock, a backup clock, and the reference clock.

SUMMARY

According to an aspect of an embodiment, a clock supplying device for supplying a clock signal to be used in an operation of a communication apparatus, includes an oscillator for generating the clock signal; a measurement unit for acquiring a reference clock signal extracted from a transmission line connected to the communication apparatus, and measuring a frequency difference between the clock signal and the reference clock signal; and a determiner for determining whether a warm-up operation of the oscillator unit has been completed or not, in accordance with measurement results of the frequency difference and a status of power supplying.

BRIEF DESCRIPTION OF DRAWINGS

FIG. 11 is a table defining a state of the clock supplying unit;

FIG. 12 is a table defining a state transition of the clock supplying unit;

FIG. 14 is a table listing outputs of the clock supplying unit; and

DESCRIPTION OF EMBODIMENTS

A clock supplying device for supplying a clock signal to be used in a communication apparatus is provided to overcome the above problems. The clock supplying device includes an oscillator unit, a measurement unit, and a determiner. The oscillator unit generates the clock signal. The measurement unit acquires a reference clock signal extracted from a transmission line connected to a communication apparatus, and measures a frequency difference between the clock signal and the reference clock signal. The determiner determines, in accordance with the measurement results of the measurement unit and a status of power supplying, whether a warm-up operation of the oscillator unit has been completed.

A clock supplying method is provided to overcome the problem. The clock supplying method is used to supply the clock signal to be used in an operation of a communication apparatus. The clock signal is generated using the oscillator unit. The reference clock signal extracted from a transmission line connected to the communication is acquired, and the frequency difference between the clock signal and the reference clock signal is measured. Whether the warm-up operation of the oscillator has been completed or not is determined in accordance with the measurement results of the frequency difference and a status of power supplying.

The clock supplying device and the clock supplying method easily determine whether the warm-up operation of the oscillator has been completed or not.

The embodiments are described below with reference to the drawings.

[First Embodiment]

Figure 1:
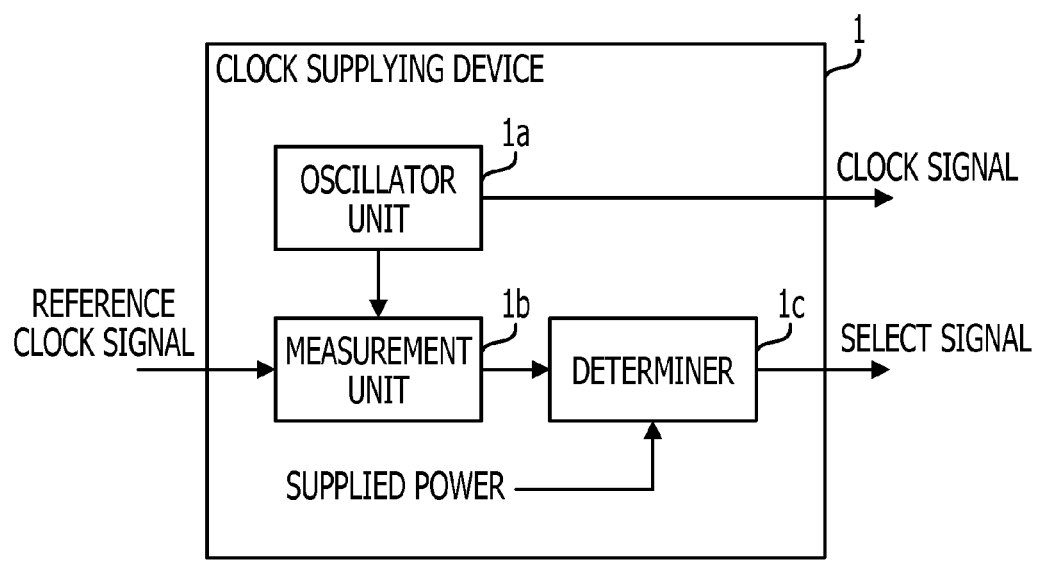
FIG. 1 illustrates a clock supplying device of a first embodiment.

FIG. 1 is a block diagram of a clock supplying device 1 of a first embodiment. The clock supplying device 1 of the first embodiment is mounted on a communication apparatus and supplies a clock signal to be used in an operation of the communication apparatus. The communication apparatus may include but is not limited to a radio base station. The clock supplying device 1 includes an oscillator unit 1a, a measurement unit 1b, and a determiner 1c.

The oscillator unit 1a generates the clock signal. The oscillator unit 1a may include but is not limited to an OCXO. The oscillator unit 1a takes a warm-up period before the oscillation frequency thereof becomes stable. The warm-up period lasts from when the oscillator unit 1a starts generating the clock signal with power supplied thereto to when the oscillation frequency becomes stable. The warm-up period time depends on a temperature of a constant temperature oven when the power supplying starts.

The measurement unit 1b acquires a reference clock signal extracted from a transmission line connected to a communication apparatus. The transmission line may include a wired line connecting a radio base station to a radio network controller (RNC). The reference clock signal is used to establish synchronization between communication apparatuses. The measurement unit 1b measures a frequency difference between the clock signal generated by the oscillator unit 1a and the reference clock signal.

The determiner 1c acquires as measurement results the frequency difference measured by the measurement unit 1b. The determiner 1c monitors a status of power supplied to one of the clock supplying device 1 and the oscillator unit 1a. Depending the measurement results of the frequency difference and the status of the supplied power, the determiner 1c determines whether the warm-up operation of the oscillator unit 1a has been completed. After the power supplying starts, the determiner 1c determines that the warm-up operation is completed when the measurement results come to satisfy a specific permission condition for the first time.

The determiner 1c may also detect a fault in the clock signal generated by the oscillator unit 1a or the reference clock signal. The determiner 1c determines that a fault has taken place if the measurement results come to fail to satisfy the specific permission condition after the completion of the warm-up operation (i.e., the measurement results once satisfy the specific permission condition). The determiner 1c also determines that a fault has taken place if the measurement results come to fail to satisfy the specific permission condition within a specific period of time subsequent to the start of the power supplying.

The oscillator unit 1a in the clock supplying device 1 generates the clock signal. The measurement unit 1b acquires the reference clock signal extracted from the transmission line connected to the communication apparatus, and measures the frequency difference between the clock signal and the reference clock signal. In response to the measurement results of the frequency difference and the status of the supplied power, the determiner 1c determines whether the oscillator unit 1a has completed the warm-up operation.

Whether the warm-up operation of the oscillator unit 1a has been completed or not is thus easily determined. In accordance with the measurement results of the frequency difference, the determiner 1c determines whether the warm-up operation has been completed or not. The clock supplying device 1 reduces an excessive waiting time more than the method of treating a constant period of time as a warm-up period. Since the measurement unit 1b measures the frequency difference using the reference clock signal extracted from the transmission line, the circuit scale of the clock supplying device 1 is reduced. A drop in the determination accuracy of the warm-up completion is reduced. The determiner 1c may detect a fault in addition to the completion of the warm-up operation.

The clock supplying device 1 may be commercially available as a standalone component. Alternatively, the clock supplying device 1 may be commercially available in a state built in the communication apparatus. The clock supplying device 1 may be built in a variety of communication apparatuses. In a second embodiment, the clock supplying device having an OCXO and generating a clock signal is installed in a radio base station.

[Second Embodiment]

Figure 2:
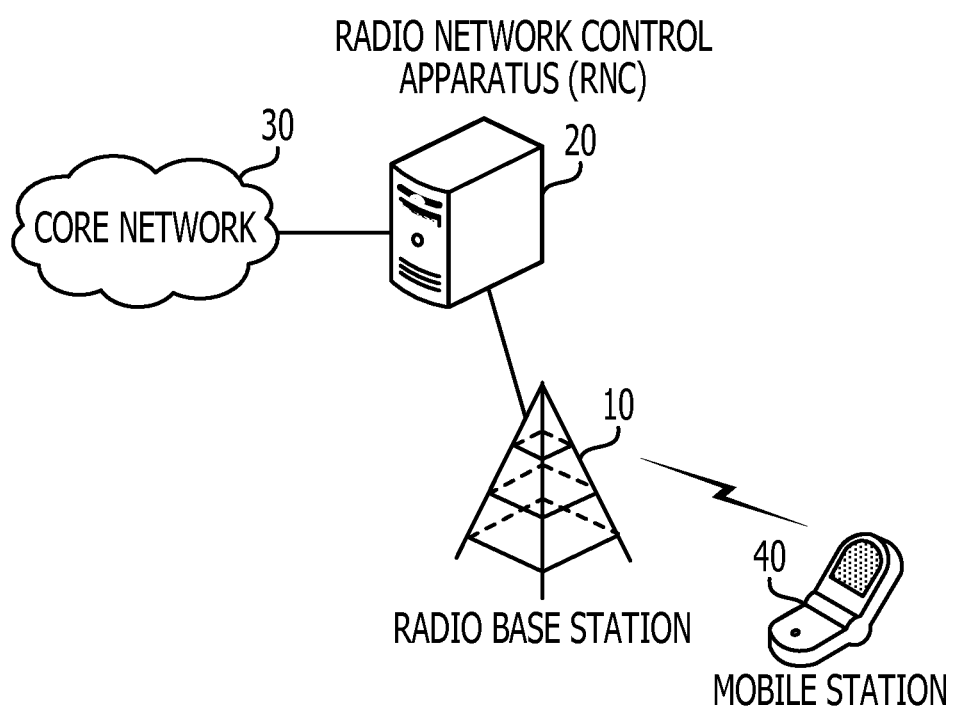
FIG. 2 illustrates a mobile communication system of a second embodiment.

FIG. 2 illustrates a mobile communication system of the second embodiment. The mobile communication system of the second embodiment includes radio base station 10, radio network control (RNC) apparatus 20, core network 30, and mobile station 40. The radio base station 10 is connected to the RNC apparatus 20 via a wired transmission line. The RNC apparatus 20 is connected to the core network 30 via a wired transmission line.

The radio base station 10 performs radio communications with the mobile station 40. The radio base station 10 receives user data from the RNC apparatus 20 and wirelessly transmits the user data to the mobile station 40. The radio base station 10 wirelessly receives user data from the mobile station 40, and transmits the user data to the core network 30 via the RNC apparatus 20. Upon being powered on by a mobile communication operator, the radio base station 10 starts operating. If the radio base station 10 is installed in an area where power supplying conditions are unstable, power supplying may be interrupted. When power is restored, the radio base station 10 performs a resume operation.

The RNC apparatus 20 controls the radio base station 10. More specifically, the RNC apparatus 20 allocates a radio channel to the mobile station 40, and performs handover control to the mobile station 40 as the mobile station 40 moves. The RNC apparatus 20 transfers the user data between the radio base station 10 and the core network 30. The radio base station 10 and the RNC apparatus 20 form a radio access network (RAN).

The core network 30 performs voice communications via line switching, and data communications via packet switching. The core network 30 includes a line switching system and a packet switching system. The core network 30 also includes a database storing subscriber information of the mobile station 40, and a database storing location information of the mobile station 40.

The mobile station 40 is linked to the radio base station 10. The mobile station 40 under the control of the radio base station 10 performs radio communications. The mobile station 40 wirelessly transmits user data to the radio base station 10, and wirelessly receives user data from the radio base station 10. A subscriber station (fixed radio terminal), which is not mobile, may be linked to the radio base station 10.

Figure 3:
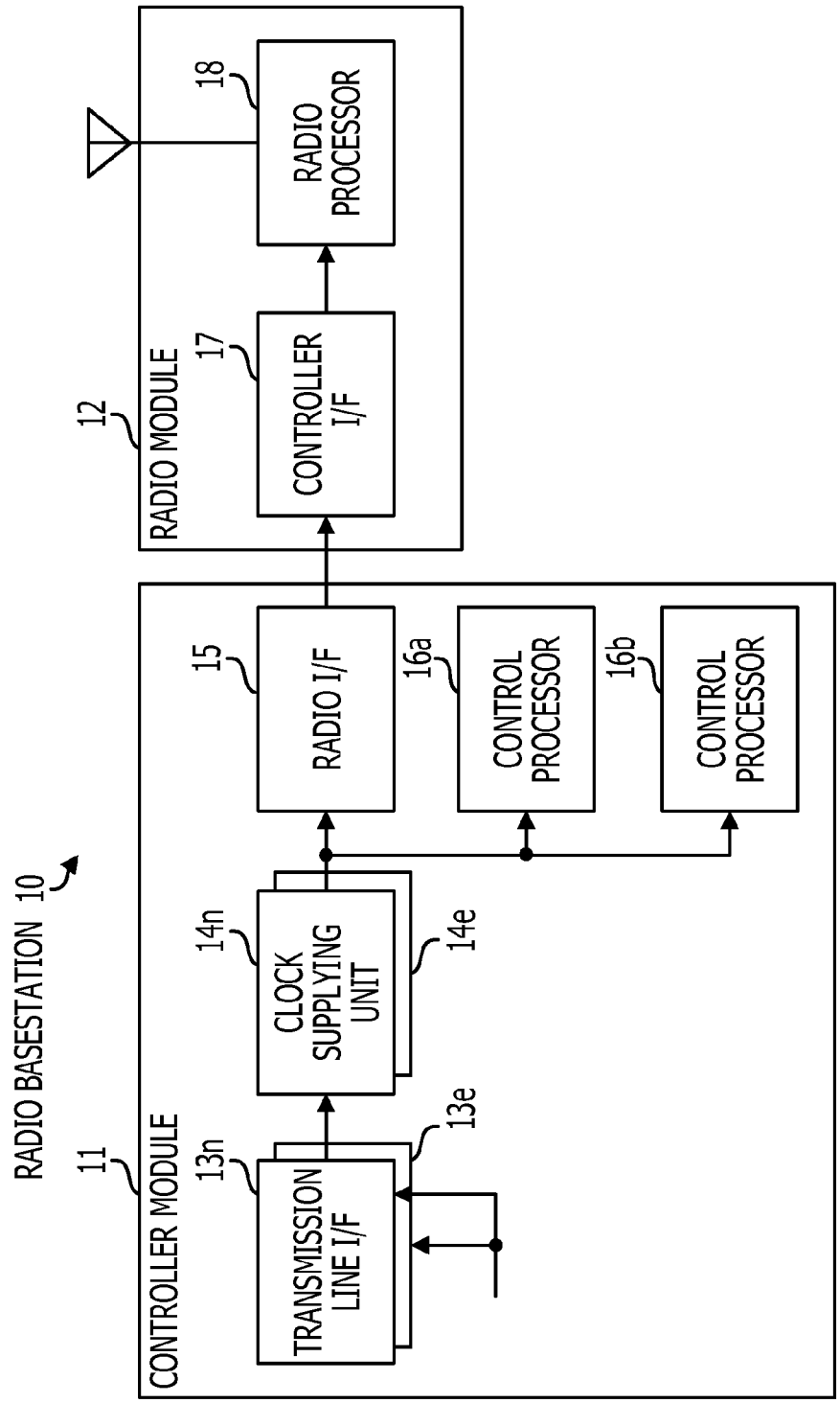
FIG. 3 is a block diagram illustrating a radio base station of the second embodiment.

FIG. 3 is a block diagram of the radio base station of the second embodiment. The radio base station 10 includes a controller module 11 and a radio module 12. The controller module 11 and the radio module 12 may be respectively constructed of integrated circuits (IC), and linked via digital signal lines.

The controller module 11 performs a digital baseband signal process and controls a radio signal process of the radio module 12. The controller module 11 includes transmission line interfaces (I/Fs) 13n and 13e, clock supplying units 14n and 14e, radio I/F 15, and control processors 16a and 16b. The radio module 12 under the control of the controller module 11 performs a radio signal process. The radio module 12 includes a controller I/F 17 and a radio processor 18.

The transmission line I/Fs 13n and 13e are wired communication interfaces connected to the transmission line between the radio base station 10 and the RNC apparatus 20. The transmission line I/Fs 13n and 13e are arranged for redundancy. The transmission line I/F 13n is a normal system (hereinafter referred to as an N system) that is used in a normal operation. The transmission line I/F 13e is an emergency system (hereinafter referred to as an E system) that is used when the transmission line I/F 13n malfunctions. The clock supplying units 14n and 14e control the switching between the reference clock signals of the transmission line I/Fs 13n and 13e.

The transmission line I/Fs 13n and 13e respectively extract the reference clock signals from the transmission line, and then outputs the reference clock signals to the clock supplying units 14n and 14e. The transmission line I/Fs 13n and 13e serve as reference clock suppliers. The reference clock signal is used to synchronize the radio base station 10 with the RNC apparatus 20, and the frequency of the reference clock signal is about 8 kHz, for example.

The clock supplying units 14n and 14e supply a system clock signal (5 MHz, for example) to be used in signal processing of the controller module 11 and the radio module 12. The clock supplying units 14n and 14e are arranged for redundancy. The clock supplying unit 14n is an N system, and the clock supplying unit 14e is an E system. The clock supplying units 14n and 14e output a system clock signal to the radio I/F 15 and the control processors 16a and 16b. The clock supplying units 14n and 14e perform warm-up control of oscillators generating the system clock signal, detect a fault, and switch between the N system and the E system. The warm-up control and the fault detection are described later.

The radio I/F 15 receives a signal from and outputs a signal to the radio module 12. The radio I/F 15 outputs a baseband signal to the radio module 12 as a transmission signal to the mobile station 40, and acquires a baseband signal from the mobile station 40 as a reception signal. The radio I/F 15 outputs the system clock signal supplied from the clock supplying units 14n and 14e to the radio module 12.

The control processors 16a and 16b perform a variety of processes on radio communications between the radio base station 10 and the mobile station 40. FIG. 3 illustrates the two control processors 16a and 16b. Optionally, the controller module 11 may include three or more control processors. The control processors 16a and 16b perform call control, file data control, and baseband signal process of the transmission signal and the reception signal. The control processors 16a and 16b perform the process thereof using the system clock signal supplied from the clock supplying units 14n and 14e.

The control processors 16a and 16b respectively include gate circuits for switching between conducting and blocking the system clock signal output by the clock supplying units 14n and 14e. The gate circuit blocks the system clock signal during the warm-up operation of the oscillator unit or during malfunction. In response to a system clock select (SEL) signal output by the clock supplying units 14n and 14e, the gate circuit determines whether to receive the system clock signal and determines which of the system clock signals output by the clock supplying units 14n and 14e to receive.

The controller I/F 17 receives a signal from and outputs a signal to the controller module 11. The controller I/F 17 acquires the baseband signal as the transmission signal from the controller module 11, and then outputs the baseband signal to the radio processor 18. The controller I/F 17 acquires the baseband signal as the reception signal from the radio processor 18, and outputs the baseband signal to the controller module 11. The controller I/F 17 outputs to the radio processor 18 the system clock signal supplied by the clock supplying units 14n and 14e via the radio I/F 15. As the control processors 16a and 16b, the controller I/F 17 includes a gate circuit. The gate circuit switches between conducting and blocking the system clock signal.

The radio processor 18 processes a radio signal transmitted to or received from the mobile station 40. The radio processor 18 down-converts a radio signal received from the mobile station 40 via an antenna into a baseband signal, and then outputs the baseband signal to the controller I/F 17. The radio processor 18 up-converts a baseband signal acquired via the controller I/F 17 into a radio signal and then outputs the radio signal via the antenna. The radio processor 18 performs a radio signal process using the system clock signal acquired via the controller I/F 17.

Figure 4:
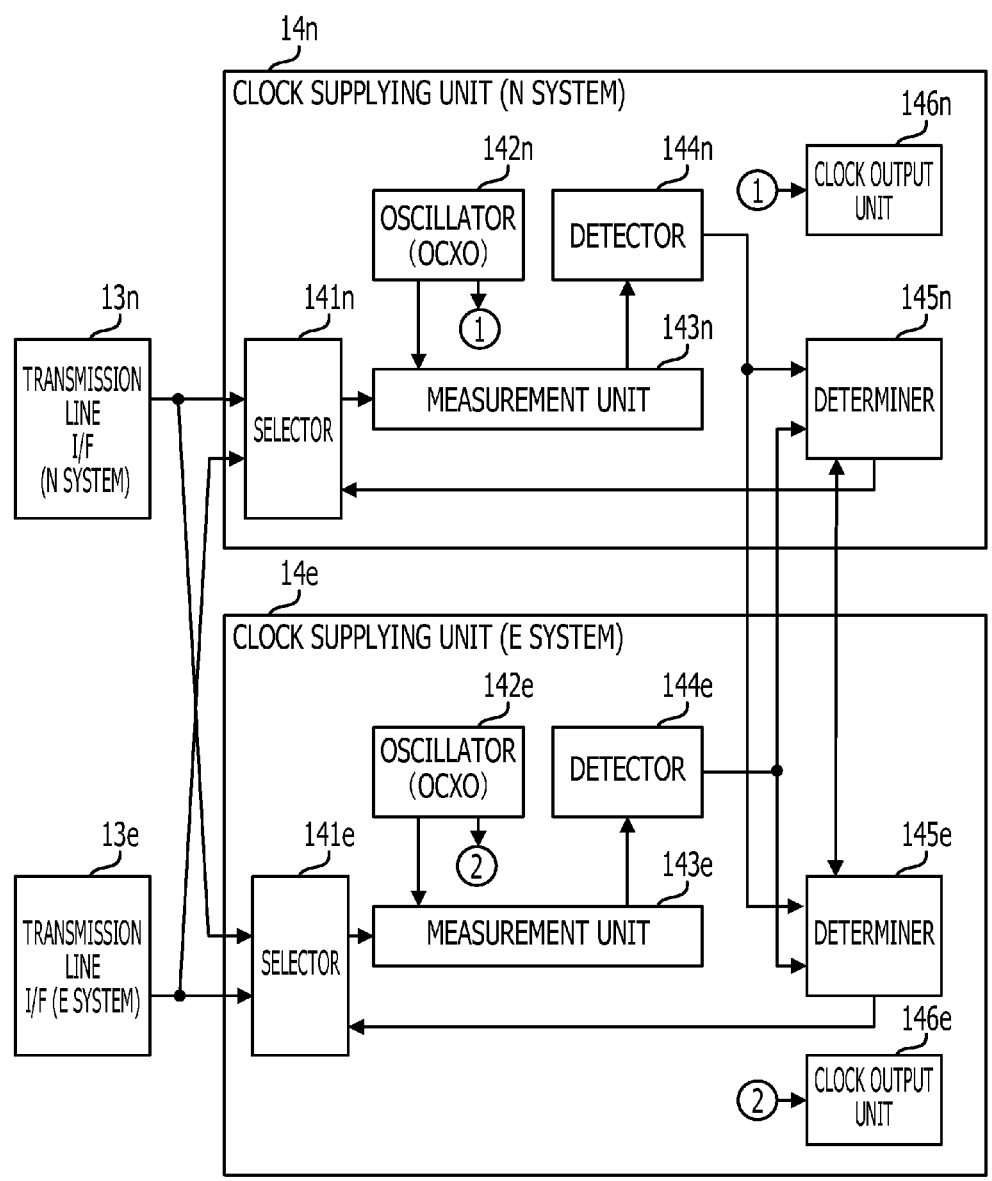
FIG. 4 is a block diagram of a clock supplying unit of the second embodiment.

FIG. 4 is a block diagram of the clock supplying units 14n and 14e of the second embodiment. The clock supplying unit 14n includes selector 141n, oscillator 142n, measurement unit 143n, detector 144n, determiner 145n, and clock output unit 146n. Similarly, the clock supplying unit 14e includes selector 141e, oscillator 142e, measurement unit 143e, detector 144e, determiner 145e, and clock output unit 146e.

The selector 141n acquires the reference clock signals from each of the transmission line I/Fs 13n and 13e, selects the reference clock signal from one of the transmission line I/Fs 13n and 13e, and outputs the selected reference clock signal to the measurement unit 143n. The selection of the reference clock signal is performed in response to a reference clock SEL signal output from the determiner 145n. The selector 141e in the E system performs an operation similar to the operation of the selector 141n. The reference clock signal selected by the selector 141n is identical to the reference clock signal selected by the selector 141e.

The oscillator 142n generates a clock signal (having 5 MHz, for example). The oscillator 142n is an OCXO. The oscillator 142n outputs the generated clock signal to each of the measurement unit 143n and the clock output unit 146n. The oscillator 142e in the E system performs an operation similar to the operation of the oscillator 142n.

The measurement unit 143n measures a frequency difference between the reference clock signal acquired via the selector 141n and the clock signal acquired from the oscillator 142n. If the measurement result falls outside a specific permission range, the measurement unit 143n outputs a fault detection signal to the detector 144n. If the measurement result falls within the specific permission range, the measurement unit 143n outputs a fault recovery signal to the detector 144n. The measurement unit 143e in the E system performs an operation similar to the operation of the measurement unit 143n.

The detector 144n detects a frequency difference measurement fault (frequency unacceptable) in response to the acquisition result of the fault detection signal or the fault recovery signal from the measurement unit 143n. For example, the detector 144n determines the frequency unacceptable if the fault detection signal has been consecutively received by a predetermined number of times, or if the fault detection signal has been received beyond a predetermined number of times within a specific period of time. The detector 144*n* thus controls erroneous detection of fault by waiting on standby for a plurality of fault detection signals. It is also acceptable that the detector 144*n* determines in response to a single reception of the fault detection signal that the frequency is unacceptable.

The detector 144*n* also detects a normal frequency difference measurement result (frequency acceptable) in a manner similar to the unacceptable frequency determination. The detector 144*n* notifies the determiners 145*n* and 145*e* of the N system measurement result indicative of the acceptable frequency or the unacceptable frequency. More specifically, the detector 144*n* notifies the determiners 145*n* and 145*e* of the measurement result at the timing the frequency becomes acceptable for the first time after power on. The detector 144*n* notifies the determiners 145*n* and 145*e* of the N system measurement result each time the acceptable frequency and the unacceptable frequency alternate. Alternatively, the detector 144*n* notifies the determiners 145*n* and 145*e* of the N system measurement result at a timing other than the timing the acceptable frequency and the unacceptable frequency alternate. The detector 144*e* performs an operation similar to the operation of the detector 144*n*. The detector 144*e* thus notifies the determiners 145*n* and 145*e* of the E system measurement result.

The determiner 145*n* acquires the N system measurement result from the detector 144*n*, and the E system measurement result from the detector 144*e*. In response to the N and E system measurement results, the determiner 145*n* determines whether each of the oscillator 142*n* and the oscillator 142*e* has completed the warm-up operation. The determiner 145*n* detects any fault in the clock signal generated by the oscillator 142*n*, the clock signal generated by the oscillator 142*e*, and the reference clock signal.

In response to the determination results, the determiner 145*n* generates the system clock SEL signal, and then outputs the generated system clock SEL signal to the radio I/F 15 and the control processors 16*a* and 16*b*. Upon determining that the reference clock signal is faulty, the determiner 145*n* generates a reference clock SEL signal and then outputs the generated reference clock SEL signal to the selector 141*n*. The determiner 145*e* performs an operation similar to the operation of the determiner 145*n*. If the reference clock signal is found to be faulty, the determiner 145*e* outputs a reference clock SEL signal to the selector 141*e*.

The clock output unit 146*n* acquires the clock signal generated by the oscillator 142*n* and then outputs the clock signal as an N system clock signal to the radio I/F 15, and the control processors 16*a* and 16*b*. The clock output unit 146*e* acquires the clock signal generated by the oscillator 142*e*, and outputs the clock signal as an E system clock signal to the radio I/F 15 and the control processors 16*a* and 16*b*.

Figure 5:
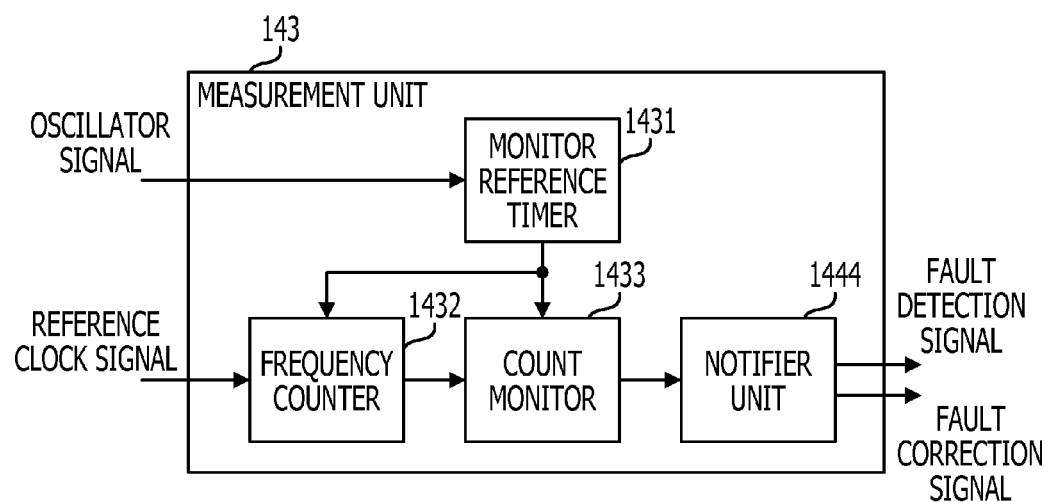
FIG. 5 is a block diagram of a measurement unit of the second embodiment.

FIG. 5 is a block diagram of a measurement unit 143 of the second embodiment. The measurement unit 143 is used for each of the measurement units 143*n* and 143*e*. The measurement unit 143 includes monitor reference timer 1431, frequency counter 1432, count monitor 1433, and notifier unit 1444.

The monitor reference timer 1431 measures a specific time in accordance with a clock signal generated by the oscillator unit as a reference. For example, the monitor reference timer 1431 measures one second using a 5 MHz clock signal as a reference. The monitor reference timer 1431 then outputs to the frequency counter 1432 and the count monitor 1433 a frame signal indicating the measurement start of the specific time and the measurement end of the specific time.

The frequency counter 1432 counts the clock of the reference clock signal every period indicated by the frame signal from the monitor reference timer 1431. For example, the frequency counter 1432 counts rising edges of the 8 kHz reference clock signal during 1 second, measured with respect to the clock signal of the oscillator. The frequency counter 1432 outputs the count value to the count monitor 1433.

Every period of the frame signal from the monitor reference timer 1431, the count monitor 1433 determines whether the count acquired from the frequency counter 1432 falls within a specific permission range. If the reference clock signal is 8 kHz, and the one period of the frame signal is 1 second, the permission range may be set to be within 7999 to 8001. The count monitor 1433 then notifies the notifier unit 1444 whether the count value is within the permission range.

Upon receiving from the count monitor 1433 a notification that the count value falls outside the permission range, the notifier unit 1444 generates and outputs the fault detection signal. Upon receiving from the count monitor 1433 that the count value falls within the permission range, the notifier unit 1444 generates and outputs the fault recovery signal.

Figure 6:
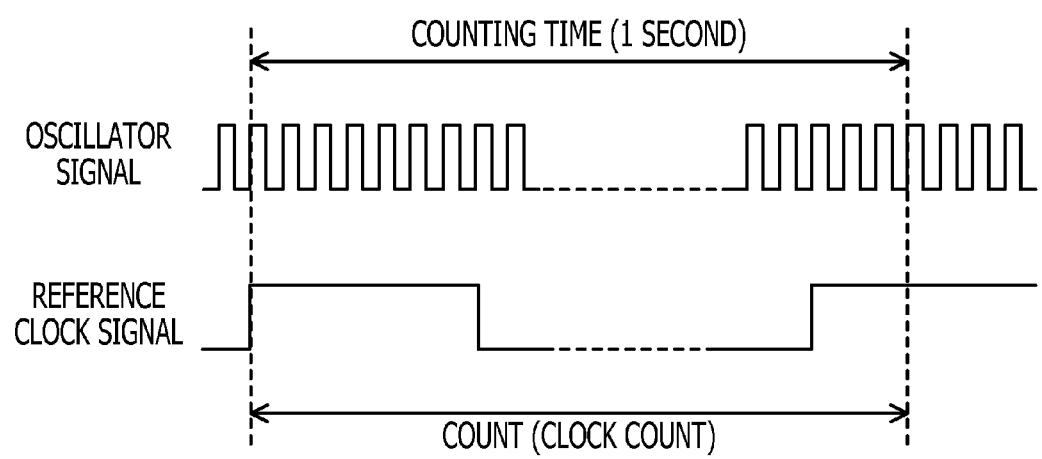
FIG. 6 is a timing chart illustrating a measurement method of a frequency difference.

FIG. 6 is a timing chart illustrating the measurement method of the frequency difference. As illustrated in FIG. 6, the measurement unit 143 measures 1 second with reference to the 5 MHz clock signal generated by the oscillator. The measurement unit 143 then counts the rising edges of the 8 kHz reference clock signal throughout the time measured in accordance with the clock signal of the oscillator.

If the clock signal of the oscillator and the reference clock signal are both accurately output, 8000 rising edges are counted. A permission range of 7999-8001 may be set up with a degree of tolerance accounted for. The probability that both the clock signal of the oscillator and the reference clock signal are faulty is considered to be low. The count value falling within the permission range may indicate that the two signals are normal, and the count falling outside the permission range may indicate that one of the two signals is faulty.

Figure 7:
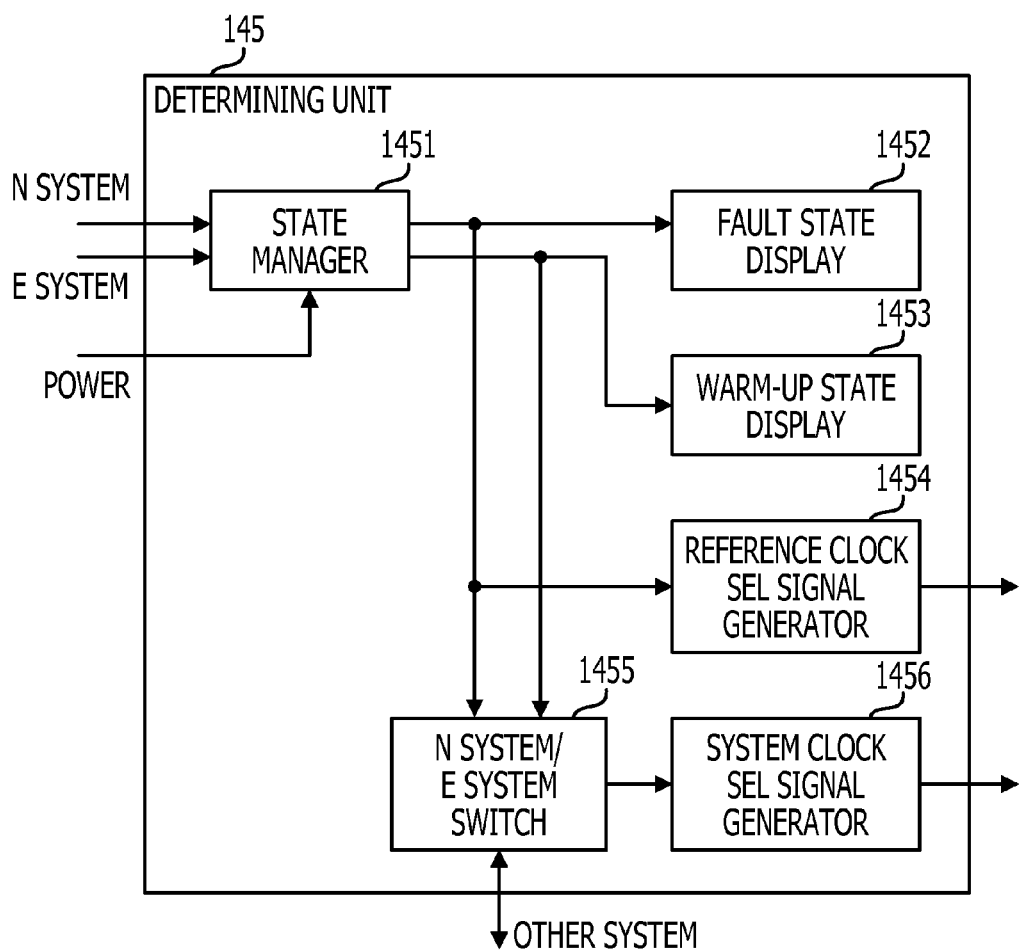
FIG. 7 is a block diagram of a determiner of the second embodiment.

FIG. 7 is a block diagram of a determiner 145 of the second embodiment. The determiner 145 may be used as one of the determiners 145*n* and 145*e*. The determiner 145 includes state manager 1451, fault state display 1452, warm-up state display 1453, reference clock SEL signal generator 1454, N system/E system switch 1455, and system clock SEL signal generator 1456.

The state manager 1451 acquires the N system measurement result from the detector 144*n*, and the S system measurement result from the detector 144*e*. The state manager 1451 monitors the status of power supplied to the clock supplying units 14*n* and 14*e* and the oscillators 142*n* and 142*e*. The state manager 1451 manages the state of the clock supplying units 14*n* and 14*e* in response to the N system measurement result and the S system measurement result and the power supply status. The state manager 1451 thus determines the fault state and the warm-up state. The state manager 1451 notifies the fault state display 1452 and the N system/E system switch 1455 of the fault state. The state manager 1451 notifies the warm-up state display 1453 and the N system/E system switch 1455 of the warm-up state.

The fault state display 1452 controls the lighting of a lamp to indicate whether the clock supplying units 14*n* and 14*e* are in a fault state or not. For example, the fault state display 1452 lights the lamp in a manner that allows the user to learn whether both the N system and the E system, only the N system, or only the E system is faulty. Each of the determiners 145*n* and 145*e* controls the state displaying of both systems. Alternatively, the determiner 145*n* may control the displaying of the state of the N system, and the determiner 145*e* may control the displaying of the state of the E system.

The warm-up state display 1453 controls the lighting of a lamp to indicate whether the warm-up operation is in progress in the clock supplying units 14*n* and 14*e*. For example, the warm-up state display 1453 lights the lamp in a manner that allows the user to learn whether both the N system and the E system have completed the warm-up operation, the warm-up operation is in progress in the N system, or the warm-up operation is in progress in the E system. Each of the determiners 145*n* and 145*e* controls the state displaying of both systems. Alternatively, the determiner 145*n* may control the displaying of the state of the N system, and the determiner 145*e* may control the displaying of the state of the E system.

Upon being notified of a fault in the reference clock signal from the state manager 1451, the reference clock SEL signal generator 1454 generates a reference clock SEL signal indicating the switching between the transmission line I/Fs 13*n* and 13*e*. The reference clock SEL signal is then output to one of the selector 141*n* and the selector 141*e*.

Upon being notified of the fault state and the warm-up state from the state manager 1451, the N system/E system switch 1455 determines whether to enable the N and E system clock signals. The N system/E system switch 1455 then notifies the N system/E system switch of the other system of the determination. The N system/E system switch 1455 also notifies the system clock SEL signal generator 1456 of the determination.

In response to the notification from the N system/E system switch 1455, the system clock SEL signal generator 1456 generates a system clock SEL signal indicating whether to enable or disable the N and E system clock signals. For example, the system clock SEL signal discriminates whether both the N system and the E system are on, only the N system is on, or only the E system is on. The system clock SEL signal is then output to the radio I/F 15 and the control processors 16*a* and 16*b*. Each of the determiners 145*n* and 145*e* may control both the N system on and the E system on. Alternatively, the determiner 145*n* may control the N system on, and the determiner 145*e* may control the E system on.

Figure 8:
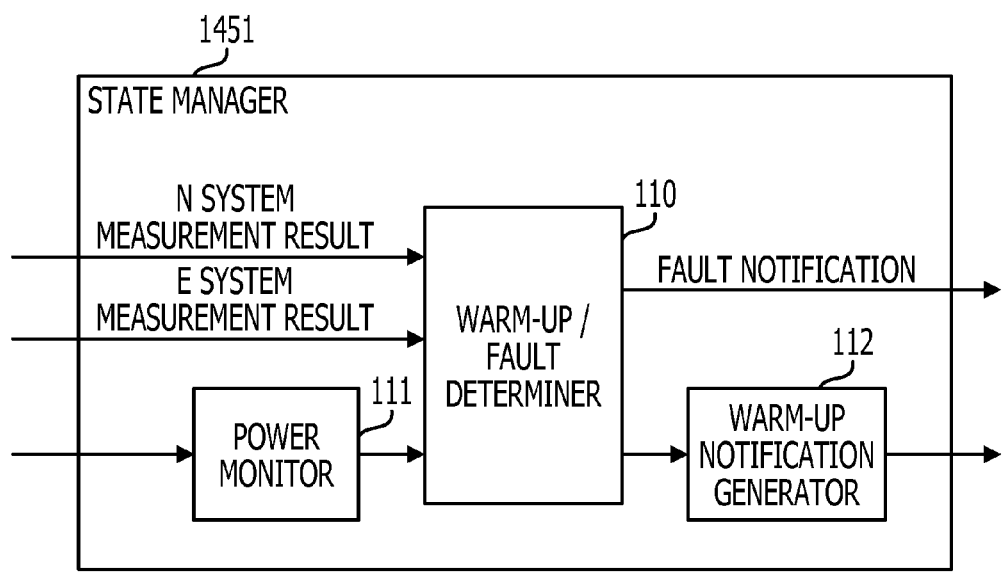
FIG. 8 is a block diagram of a state manager of the second embodiment.

FIG. 8 is a block diagram illustrating the state manager 1451 of the second embodiment. The state manager 1451 includes warm-up/fault determiner 110, power monitor 111, and warm-up notification generator 112.

The warm-up/fault determiner 110 acquires the N measurement result and the E measurement result. The warm-up/fault determiner 110 receives from the power monitor 111 a notification of the start of power (power-on) and a notification of interruption and end (power-off). In response to the notification of the power-on, the warm-up/fault determiner 110 starts up the monitor timer. The warm-up/fault determiner 110 manages state transition in response to a variety of triggers. The triggers include the power-on, the power-off, the N system frequency acceptable, the N system frequency unacceptable, the E system frequency acceptable, the E system frequency unacceptable, and the time-out. In response to a state subsequent to a transition, the warm-up/fault determiner 110 generates and outputs a fault notification, and notifies the warm-up notification generator 112 of the warm-up state.

The power monitor 111 monitors the power supply status to the clock supplying units 14*n* and 14*e* or the oscillators 142*n* and 142*e*. Upon detecting the power-on or the power-off, the power monitor 111 notifies of the warm-up/fault determiner 110 of the detected power-on or power-off.

In response to a notification from the warm-up/fault determiner 110, the warm-up notification generator 112 notifies generates and outputs a warm-up notification indicative of the system in the warm-up operation.

Figure 9:
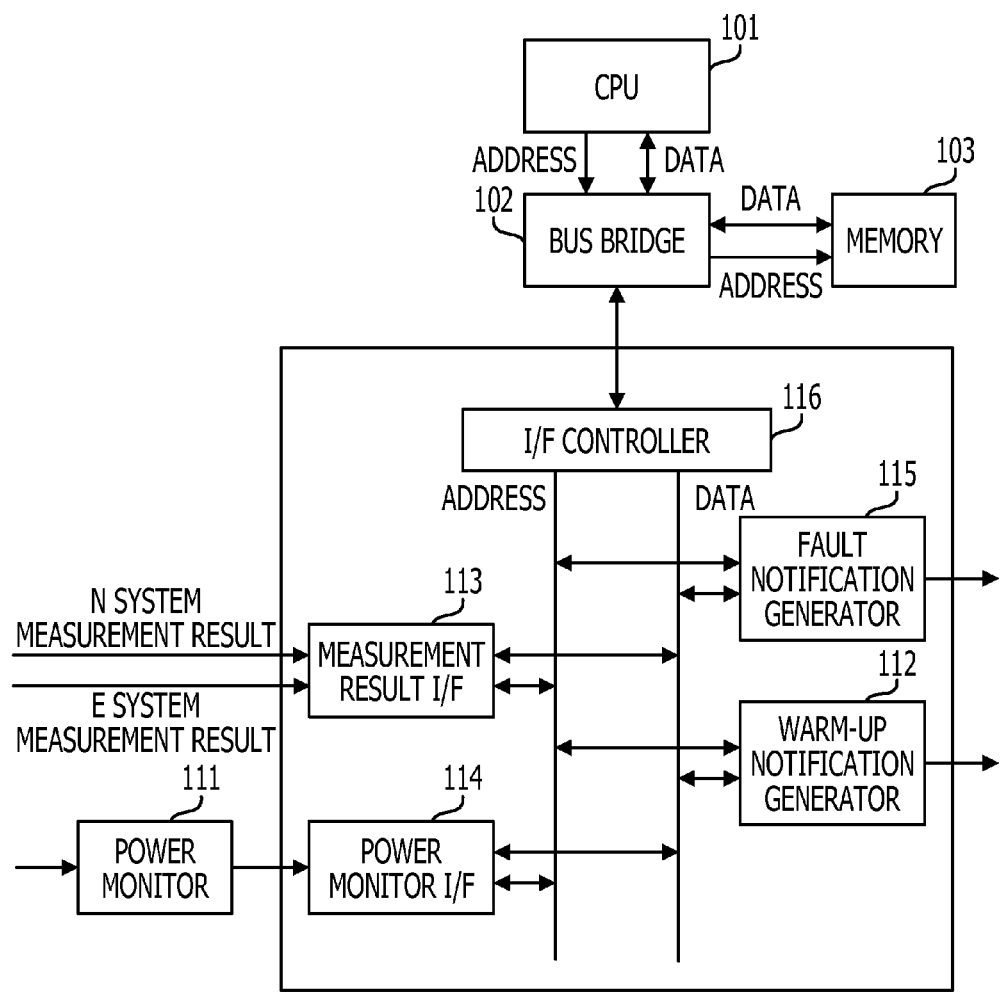
FIG. 9 is a block diagram of a first mounting example of the state manager.

FIG. 9 is a block diagram illustrating a first mounting example of the state manager 1451. The state manager 1451 includes central processing unit (CPU) 101, bus bridge 102, memory 103, power monitor 111, warm-up notification generator 112, measurement result I/F 113, power monitor I/F 114, fault notification generator 115, and I/F controller 116.

The warm-up/fault determiner 110 corresponds to a group of the CPU 101, the bus bridge 102, the memory 103, the measurement result I/F 113, the power monitor I/F 114, the fault notification generator 115, and the I/F controller 116. The warm-up notification generator 112, the measurement result I/F 113, the power monitor I/F 114, the fault notification generator 115, and the I/F controller 116 may be mounted as a field programmable gate array (FPGA) or a large-scale integrated circuit (LSI).

The CPU 101 executes a program of state management. The CPU 101 acquires event data from one of the measurement result I/F 113 and the power monitor I/F 114, decides a next state, and then determines whether to perform a fault notification or a warm-up notification responsive to the decided next state. The CPU 101 then outputs notification data to one of the warm-up notification generator 112 and the fault notification generator 115. The CPU 101 executes the program for state management. Upon receiving a command from a management terminal, the CPU 101 reports the present position of the management terminal and modifies the setting of the management terminal. To access the memory 103, the CPU 101 specifies a memory address.

The bus bridge 102 causes data to be exchanged between the CPU 101, the memory 103, and the I/F controller 116.

The memory 103 is a volatile memory temporarily storing a program and data. Subsequent to power-on, a state management program and data (such as a state transition table) referenced in a process of the state management program are expanded on the memory 103. The state management program and the referenced data are pre-stored on a non-volatile memory (not illustrated) in the state manager 1451. The memory 103 performs a write operation to a memory area corresponding to an address specified by the CPU 101 and a read operation to a memory area corresponding to an address specified by the CPU 101.

As described above, the power monitor 111 monitors the power supply status. Upon detecting a power-on operation or a power-off operation, the power monitor 111 notifies the power monitor I/F 114 of the power-off operation or the power-on operation.

The warm-up notification generator 112 acquires the notification data from the CPU 101 via the I/F controller 116. As described above, the warm-up notification generator 112 generates and outputs the warm-up notification indicative of the system in the warm-up operation.

The measurement result I/F 113 acquires the N system measurement result and the E system measurement result. The measurement result I/F 113 generates event data of the measurement results (the N system frequency acceptable, the N system frequency unacceptable, the E system frequency acceptable, and the E system frequency unacceptable), and outputs the event data to the CPU 101 via the I/F controller 116.

The power monitor I/F 114 acquires a notification of the power supply status from the power monitor 111. The power monitor I/F 114 then generates event data related to the power (power acceptable and power unacceptable), and outputs the event data to the CPU 101 via the I/F controller 116.

The fault notification generator 115 acquires the notification data from the CPU 101 via the I/F controller 116. The fault notification generator 115 generates and outputs a fault notification indicative of a location of fault.

The I/F controller 116 controls data exchange with the bus bridge 102. The I/F controller 116 may be connected to the bus bridge 102 via peripheral component interconnect (PCI) or PCI-X. The I/F controller 116 connects to the warm-up notification generator 112, the measurement result I/F 113, the power monitor I/F 114, and the fault notification generator 115.

Figure 10:
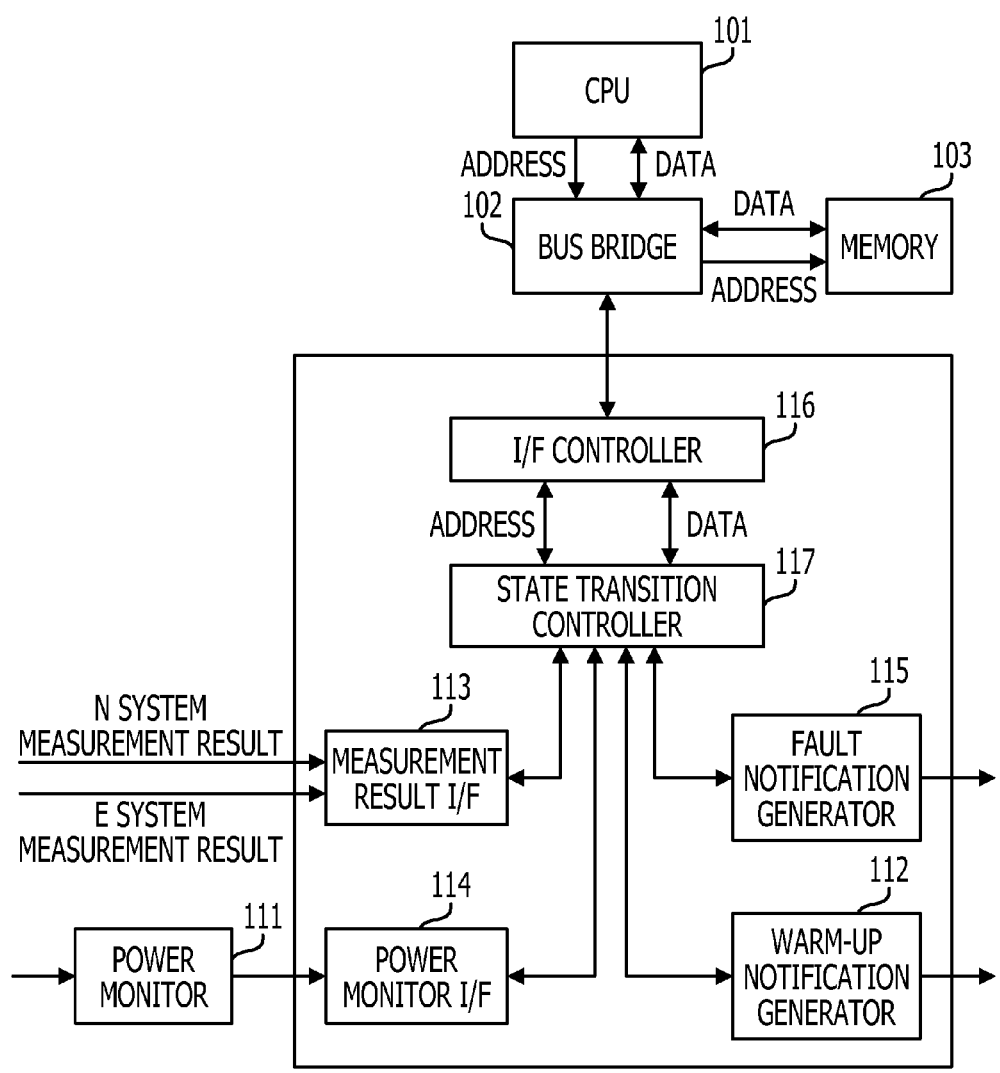
FIG. 10 is a block diagram of a second mounting example of the state manager.

FIG. 10 is a block diagram of a second mounting example of the state manager 1451. The state manager 1451 includes CPU 101, bus bridge 102, memory 103, power monitor 111, warm-up notification generator 112, measurement result I/F 113, power monitor I/F 114, fault notification generator 115, I/F controller 116, and state transition controller 117.

The warm-up/fault determiner 110 corresponds to a group including the measurement result I/F 113, the power monitor I/F 114, the fault notification generator 115, and the state transition controller 117. The warm-up notification generator 112, the measurement result I/F 113, the power monitor I/F 114, the fault notification generator 115, the I/F controller 116, and the state transition controller 117 are mounted as an FPGA or LSI.

The CPU 101 executes a program for management as in the first mounting example. Unlike the first mounting example, the second mounting example is free from execution of the program for state management. The operation of the bus bridge 102, the memory 103, the power monitor 111, and the I/F controller 116 is identical to the operation of the counterparts in the first mounting example.

The warm-up notification generator 112 acquires notification data from the state transition controller 117, and generates and outputs a warm-up notification. The measurement result I/F 113 acquires the N system measurement result and the E system measurement result, generates event data related to the measurement results, and outputs the event data to the state transition controller 117. The power monitor I/F 114 acquires a notification of the power supply status from the power monitor 111, generates the event data related to the power supply, and then outputs the event data to the state transition controller 117. The fault notification generator 115 acquires notification data from the state transition controller 117, and generates and outputs a fault notification indicative of a location of fault.

The state transition controller 117 acquires event data from one of the measurement result I/F 113, and the power monitor I/F 114, decides a next state, and determines whether to perform a fault notification or a warm-up notification in response to the decided state. The state transition controller 117 then outputs the notification data to one of the warm-up notification generator 112 and the fault notification generator 115. The state transition controller 117 implements in a wired logic the state management function of the CPU 101 of the first mounting example. The state transition controller 117 may include a non-volatile memory storing the state transition table.

FIG. 11 is a table defining the stages of the clock supplying units 14n and 14e. States #1-#10 are defined with reference to the clock supplying units 14n and 14e. More specifically, the states #1-#10 are defined in accordance with a combination of states of own system and the other system (power-off, warm-up in progress, fault, normal). If viewed from the clock supplying unit 14n, own system is the N system, and the other system is the E system. If viewed from the clock supplying unit 14e, on the other hand, own system is the E system, and the other system is the N system.

(1) In state #1, both own system and the other system are powered off (initial state).

(2) In state #2, both own system and the other system are in the warm-up operation.

(3) In state #3, own system is in a normal operation, while the other system is in the warm-up operation.

(4) In state #4, own system is in the warm-up operation, while the other system is in the normal operation.

(5) In state #5, both own system and the other system are in the normal operation.

(6) In state #6, own system is in a fault state, while the other system in the warm-up operation.

(7) In state #7, own system in the fault state, while the other system is in the normal state.

(8) In step #8, own system is in the warm-up operation, while the other system is in the fault state.

(9) In step #9, own system in the normal state, while the other state is in the fault state.

(10) In step #10, own system is in the fault state, while the other system is in the fault state.

FIG. 12 is a table defining state transitions of the clock supplying unit. The state manager 1451 may retain as data a state transition table of FIG. 12, and may manage states.

(1) If power-on is detected in state #1, the state manager 1451 transitions to state #2. The monitor timer having a specific time set therein is started. With power supplied, the oscillators 142n and 142e start generating the clock signals.

(2) If own system frequency acceptable is detected in state #2, the state manager 1451 transitions to state #3. If the other system frequency acceptable is detected, the state manager 1451 transitions to state #4. If the time-out of the monitor timer is detected, it is suspected that the reference clock signal is faulty. The state manager 1451 transitions to state #10. If the power-off is detected, the monitor timer stops and the state manager 1451 transitions to state #1.

(3) If the other system frequency acceptable is detected in state #3, the monitor timer stops. The state manager 1451 transitions to state #5. If own system frequency unacceptable is detected, the state manager 1451 transitions to state #6. If the time-out of the monitor timer is detected, the state manager 1451 transitions to state #9. If the power-off is detected, the monitor timer stops, and the state manager 1451 transitions to state #1.

(4) If own system frequency acceptable is detected in state #4, the monitor timer stops, and the state manager 1451 transitions to state #5. If the other system frequency unacceptable is detected, the state manager 1451 transitions to state #8. If the time-out of the monitor timer is detected, the state manager 1451 proceeds to state #7. If the power-off is detected, the monitor timer stops, and the state manager 1451 transitions to state #1.

(5) If own system frequency unacceptable is detected in state #5, the state manager 1451 transitions to state #7. If the other system frequency unacceptable is detected, the state manager 1451 transitions to state #9. If the power-off is detected, the state manager 1451 transitions to state #1.

(6) If own system frequency acceptable is detected in state #6, the state manager 1451 transitions to state #3. If the other system frequency acceptable is detected, the monitor timer stops, and the state manager 1451 transitions to state #7. If the time-out of the monitor timer is detected, the state manager 1451 transitions to state #10. If the power-off is detected, the monitor timer stops and the state manager 1451 transitions to state #1.

(7) If own system frequency acceptable is detected in state #7, the state manager 1451 transitions to sate #5. If the other system frequency unacceptable is detected, the state manager 1451 transitions to state #10. If the power-off is detected, the state manager 1451 transitions to state #1.

(8) If own system frequency acceptable is detected in state #8, the monitor timer stops, and the state manager 1451 transitions to state #9. If the other system frequency acceptable is detected, the state manager 1451 transitions to state #4. If the time-out of the monitor timer is detected, the state manager 1451 transitions to state #10. If the power-off is detected, the monitor timer stops and the state manager 1451 transitions to state #1.

(9) If the other system frequency acceptable is detected in state #9, the state manager 1451 transitions to state #5. If own system frequency unacceptable is detected, the state manager 1451 transitions to state #10. If the power-off is detected, the state manager 1451 transitions to state #1.

(10) If own system frequency acceptable is detected in state #10, the state manager 1451 transitions to state #9. If the other system frequency acceptable is detected, the state manager 1451 transitions to state #7. If the power-off is detected, the state manager 1451 transitions to state #1.

Figure 13:
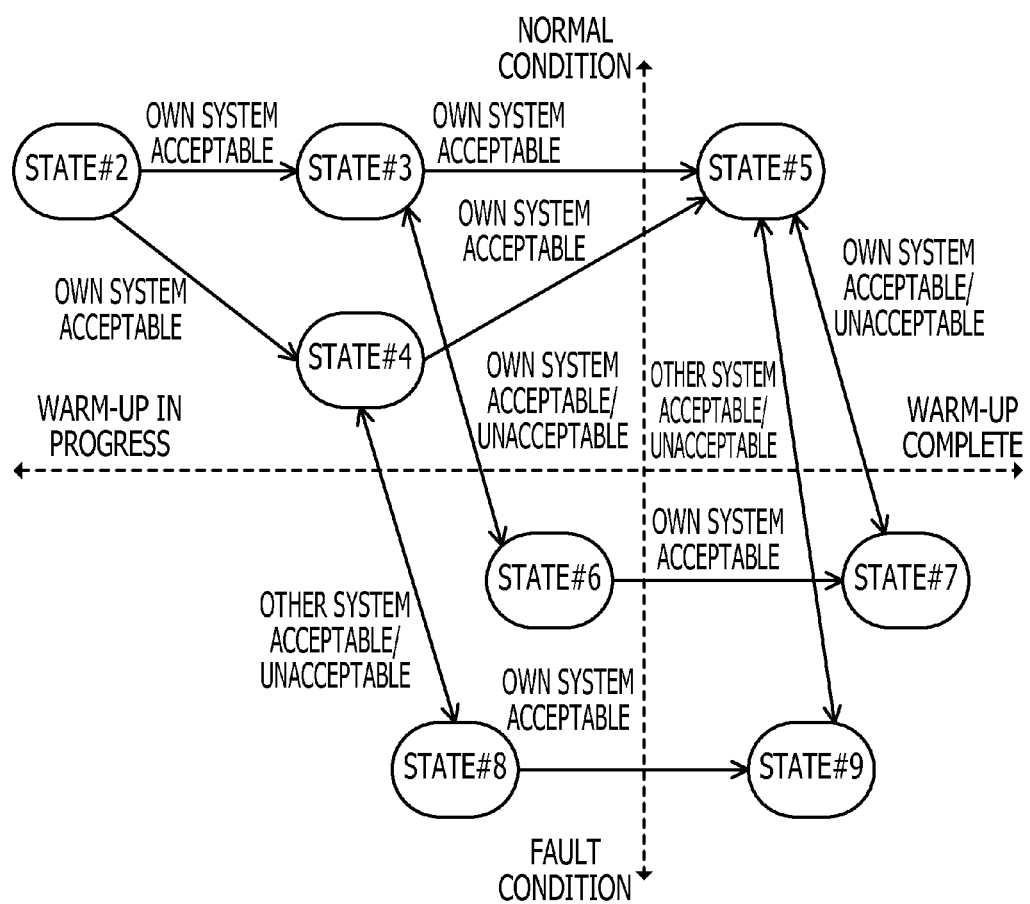
FIG. 13 illustrates part of the state transition of the clock supplying unit.

FIG. 13 illustrates part of the state transition of the clock supplying unit. States #2-#9 are divided into four groups depending on whether both the clock supplying units 14n and 14e have completed the warm-up operation and whether both the clock supplying units 14n and 14e operate in normal condition.

States #2, #3, and #4 indicate that the clock supplying units 14n and 14e operate in a normal condition although at least one of the clock supplying units 14n and 14e is in the warm-up operation. States #6 and #8 indicate that one of the clock supplying units 14n and 14e is in the warm-up operation but the other of the clock supplying units 14n and 14e malfunctions. States #7 and #9 indicate that one of the clock supplying units 14n and 14e comes to malfunction after both the clock supplying units 14n and 14e have completed the warm-up operation. State #5 indicates that both the clock supplying units 14n and 14e operate in a normal condition after having completing the warm-up operation.

As illustrated in FIG. 13, a period from the start of the power supplying to the first occurrence of the frequency acceptable (i.e., duration of the frequency unacceptable) is regarded as the warm-up period. In contrast, a transition from the frequency acceptable to the frequency unacceptable is regarded as an occurrence of a fault. Once the warm-up operation has been regarded as being completed, the warm-up operation does not resume unless the event of the power-on or the power-off occurs.

FIG. 14 is a table listing the outputs of the clock supplying unit. The determiners 145n and 145e perform the operation of FIG. 14 in response to the states #1-#10.

(1) In state #1, the system clock SEL signal is set to be off (in a state with none of the N and E system clock signals selected). Neither the fault state nor the warm-up state is displayed.

(2) In state #2, the system clock SEL signal is set to be off. The N system and the E system are displayed to be in the warm-up operation.

(3) If the N system is in state #3 (with the E system in state #4), the system clock SEL signal is set to an N system on (with the N system clock signal selected). The E system is displayed to be in the warm-up operation. The system clock SEL signal may be set to be off until the completion of the E system warm-up.

(4) If the N system is in state #4 (with the E system in state #3), the system clock SEL signal is set to be off. The N system is displayed to be in the warm-up operation.

(5) In state #5, the system clock SEL signal is set to be the N system on. Both the N system and the E system are displayed to be in a normal condition.

(6) If the N system is in state #6 (with the E system in #8), the system clock SEL signal is set to be off. The N system is displayed to be faulty, and the E system is displayed to be in the warm-up operation.

(7) If the N system is in state #7 (with the E system in state #9), the system clock SEL signal is set to be the E system on (with the clock signal of the E system selected). The N system is displayed to be faulty.

(8) If the N system is in state #8 (with the E system in state #6), the system clock SEL signal is set to be off. The E system is displayed to be faulty, and the N system is displayed in the warm-up operation.

(9) If the N system is in state #9 (with the E system in state #7), the system clock SEL signal is set to be the N system on. The E system is displayed to be faulty.

(10) In state #10, the system clock SEL signal is set to be off. The determiners 145n and 145e generate the reference clock SEL signals indicative of the switching of the reference clock signal. The determiners 145n and 145e may indicate that the reference clock signal is faulty.

Figure 15:
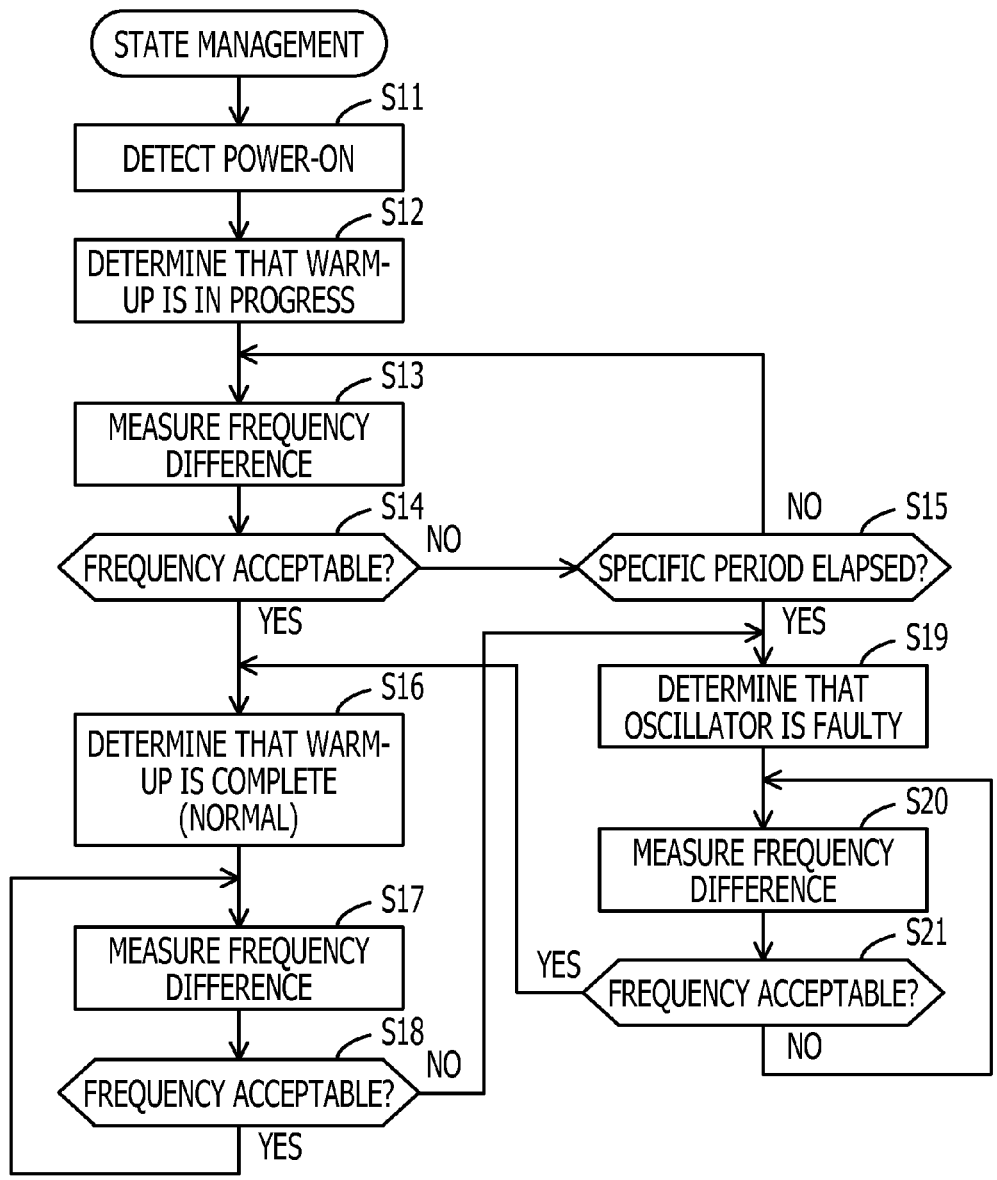
FIG. 15 is a flowchart illustrating a state management of the clock supplying unit.

FIG. 15 is a flowchart illustrating the state management of the clock supplying unit. This flowchart focuses on one of the N system measurement result and the E system measurement result as a state transition trigger. In the discussion that follows, the clock supplying unit 14n performs on the N system measurement result the process thereof in accordance with operation numbers of FIG. 15. The clock supplying unit 14e also performs a process similar to the process of the clock supplying unit 14n.

(Operation S11) The determiner 145n detects the start of power supplying (power-on). The power-on may be detected when a user operates a power switch, or when power is restored after an interruption of the power supply.

(Operation S12) The determiner 145n determines that the oscillator 142n is in the warm-up operation. Immediately subsequent to the power-on, the oscillator 142e is also determined as being in the warm-up operation.

(Operation S13) The measurement unit 143n measures a frequency difference between the clock signal generated by the oscillator 142n and the reference clock signal extracted by the transmission line I/F 13n. The measurement unit 143n then determines whether the frequency difference is within the permission range.

(Operation S14) Depending on whether the frequency difference falls within the permission range, the detector 144n determines whether the clock signal of the oscillator 142n is frequency acceptable or not. If the clock signal is frequency acceptable, processing proceeds to operation S16. If the clock signal is not frequency acceptable, processing proceeds to operation S15.

(Operation S15) The determiner 145n determines whether a specific period of time has elapsed since the detection of the power-on. If the specific period of time has elapsed, the clock supplying unit 14n proceeds to operation 519. If the specific period of time has not elapsed, the clock supplying unit 14n returns to operation S13.

(Operation S16) The determiner 145n then determines that the oscillator 142n has completed the warm-up operation and thus operates normally. State transition is performed. Subsequent to the state transition, the determiner 145n outputs the system clock SEL signal and displays the state.

(Operation S17) The measurement unit 143n measures a frequency difference between the clock signal generated by the oscillator 142n and the reference clock signal. The measurement unit 143n determines whether the frequency difference falls within a permission range.

(Operation S18) Depending on whether the frequency difference falls within the permission range, the detector 144n determines whether the clock signal of the oscillator 142n is frequency acceptable. If the clock signal is frequency acceptable, processing returns to operation S17. If the clock signal is frequency unacceptable, processing proceeds to operation S19.

(Operation S19) The determiner 145n determines that the oscillator 142n is faulty. In other words, state transition is performed. Depending on the state subsequent to state transition, the determiner 145n outputs the system clock SEL signal and displays the state.

(Operation S20) The measurement unit 143n measures a frequency difference between the clock signal generated by the oscillator 142n and the reference clock signal. The measurement unit 143n then determines whether the frequency difference falls within the permission range.

(Operation S21) Depending on whether the frequency difference falls within the permission range, the detector 144n determines whether the clock signal of the oscillator 142n is frequency acceptable. If the clock signal is frequency acceptable, processing returns to operation S16. If the clock signal is frequency unacceptable, processing returns to operation S20.

The determiner 145n then determines that the oscillator 142n is in the warm-up operation from the detection of the power-on to the detection of the first frequency acceptable. The frequency unacceptable subsequent to the completion of the warm-up operation indicates a fault. If the frequency unacceptable is followed by the frequency acceptable, the determiner 145n determines that the fault is corrected. If the power-on is not followed by the frequency acceptable within a specific period of time, the determiner 145n determines that a fault exists. If both the N system and the E system are faulty, a faulty reference clock signal may be suspected of being faulty.

In response to the measurement results of the frequency difference, the radio base station 10 of the second embodiment determines the timing of the completion of the warm-up operation of the oscillators 142n and 142e. An excessive waiting time is thus reduced in comparison with the method of treating a constant period of time as a warm-up time. Since the reference clock signal extracted from the transmission line is used to measure the frequency difference, the clock supplying units 14n and 14e need no more oscillator for measuring the frequency difference. The scale of the device is reduced.

The determiners 145n and 145e manage the state transition triggered by the event related to the frequency difference, and the event related to the power supply status. The determiners 145n and 145e manage the completion of the warm-up operation and the generation of the fault in a consistent fashion. Consistency between the warm-up control and the switching control of the N system and the E system is assured. Appropriate clock supplying control is performed.

All examples and conditional language recited herein are intended for pedagogical purposes to aid the reader in understanding the invention and the concepts contributed by the inventor to furthering the art, and are to be construed as being without limitation to such specifically recited examples and condition, nor does the organization of such examples in the specification relate to a showing of superiority and inferiority of the invention. Although the embodiment of the present inventions have been described in detail, it should be understood that the various changes, substitutions, and alternations could be made hereto without departing from the spirit and scope of the invention.

The invention claimed is:

1. A clock supplying device for supplying a clock signal for use in an operation of a communication apparatus, comprising:
a first oscillator configured to generate a first clock signal;
a second oscillator configured to generate a second clock signal;
first measurement circuitry configured to acquire a reference clock signal extracted from a transmission line coupled to the communication apparatus, and to measure a first frequency difference between the first clock signal and the reference clock signal;
second measurement circuitry configured to acquire the reference clock signal, and to measure a second frequency difference between the second clock signal and the reference clock signal; and
a first determiner configured to determine whether warm-up operations of the first oscillator and the second oscillator have been completed or not, in accordance with measurement results of the first and second frequency differences, and to control which of the clock signals of the oscillators set as usable in accordance with the determination, wherein
the first determiner comprises a state manager configured to manage a state of units comprising the first and second oscillators, and wherein the state manager comprises:
a generator configured to generate a warm-up notification relating a warm up state of the first and second oscillators,
a power monitor configured to provide a start of power notification upon a start of power supply to the first and second oscillators, and
a second determiner configured to receive the measurement results of the first and second frequency differences and the start of power notification and to notify t generator of the warm up state in the first and second oscillators in accordance with the measurement results of the first and second frequency differences and a time elapsed after the start of power supply.

2. The clock supplying device according to claim 1, wherein the first determiner is configured to determine that the warm-up operation has been completed in the first or second oscillator when the measurement results satisfy a specific permission condition for the first time since the start of power supply to the first and second oscillators.

3. The clock supplying device according to claim 2, wherein the first determiner is configured to determine that the first or second oscillator is in a fault state when the measurement results continuously fail to satisfy a specific permission condition until the specific period of time has elapsed since the start of power supply to the first and second oscillators.

4. The clock supplying device according to claim 2, wherein the first determiner is configured to determine that the first or second oscillator is in a fault state when the measurement results fail a specific permission condition after the completion of the warm-up operation.

5. The clock supplying device according to claim 1, wherein the first determiner is configured to determine whether each of the first and second oscillators has completed the warm-up operation, determine whether a fault has been detected in each of the first and second oscillator units, and control which of the clock signals of the oscillators to set as usable, in accordance with the measurement results of the first and second frequency differences.

6. The clock supplying device according to claim 1, wherein the first determiner is configured to output externally to the clock supplying device a signal indicating a usable clock signal.

7. A clock supplying method for use in a clock supplying device for supplying a clock signal to be used in an operation of a communication apparatus, comprising:
   generating a first clock signal by a first oscillator;
   generating a second clock signal by a second oscillator;
   acquiring a reference clock signal extracted from a transmission line coupled to the communication apparatus, and measuring a first frequency difference between the first clock signal and the reference clock signal and a second frequency difference between the second clock signal and the reference clock signal;

determining whether a warm-up operation of the first oscillator and the second oscillator have been completed or not, in accordance with measurement results of the first and second frequency differences and a status of power supplying to the first and second oscillators, and controlling which of the clock signals of the oscillators to set as usable in accordance with said determining, wherein the determining comprises receiving notification of a start of power supply to the first and second oscillators, receiving measurement results of the first and second frequency differences, and notifying a up state in the first and second oscillators in accordance with the measurement results of the first and second frequency differences and a time elapsed after the start of power supply.

* * * * *